US011705307B2

(12) United States Patent
Chen

(10) Patent No.: US 11,705,307 B2
(45) Date of Patent: Jul. 18, 2023

(54) PLASMA SYSTEM AND FILTER DEVICE

(71) Applicant: BEIJING NAURA MICROELECTRONICS EQUIPMENT CO., LTD., Beijing (CN)

(72) Inventor: Peng Chen, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/641,415

(22) PCT Filed: Aug. 21, 2020

(86) PCT No.: PCT/CN2020/110414
§ 371 (c)(1),
(2) Date: Mar. 8, 2022

(87) PCT Pub. No.: WO2021/047375
PCT Pub. Date: Mar. 18, 2021

(65) Prior Publication Data
US 2022/0270861 A1 Aug. 25, 2022

(30) Foreign Application Priority Data
Sep. 9, 2019 (CN) .......................... 201910845812.9

(51) Int. Cl.
*H01J 37/32* (2006.01)
*B08B 7/00* (2006.01)
*B08B 13/00* (2006.01)

(52) U.S. Cl.
CPC ...... *H01J 37/32422* (2013.01); *B08B 7/0035* (2013.01); *B08B 13/00* (2013.01);
(Continued)

(58) Field of Classification Search
CPC ............ H01J 37/32715; H01J 37/3244; H01J 37/32862; H01J 37/32119; H01J 37/32422; B08B 13/00; B08B 7/0035
See application file for complete search history.

(56) References Cited

U.S. PATENT DOCUMENTS

| 4,534,842 A | 8/1985 | Arnal et al. | |
| 2009/0311869 A1* | 12/2009 | Okesaku | H01J 37/3244 427/575 |

(Continued)

FOREIGN PATENT DOCUMENTS

| CN | 101227984 A | 7/2008 |
| CN | 102486986 A | 6/2012 |

(Continued)

OTHER PUBLICATIONS

The World Intellectual Property Organization (WIPO) International Search Report for PCT/CN2020/110414 dated Nov. 16, 2020 5 Pages (with translation).

*Primary Examiner* — Yuechuan Yu
(74) *Attorney, Agent, or Firm* — Anova Law Group, PLLC

(57) ABSTRACT

A plasma system and a filter device are provided. In the system, an area surrounded by a dielectric window is configured as a first chamber for accommodating plasma. A first adapter is arranged under the dielectric window. An area surrounded by the first adapter is configured as a second chamber. A lower electrode platform is placed in the second chamber to carry a workpiece. A filter member of the filter device is placed at an intersection of the first chamber and the second chamber. The filter member includes through-holes configured to filter ions from the plasma. A first extension member extends from the filter member in a first direction and is placed over the first adapter. A second (Continued)

extension member extends from a position of the filter member adjacent to the first extension member to an inner side of the first adapter.

20 Claims, 19 Drawing Sheets

(52) U.S. Cl.
 CPC ..... *H01J 37/3244* (2013.01); *H01J 37/32119* (2013.01); *H01J 37/32715* (2013.01); *H01J 37/32862* (2013.01)

(56) References Cited

U.S. PATENT DOCUMENTS

| | | | |
|---|---|---|---|
| 2010/0170438 A1* | 7/2010 | Saywell | B23K 20/023 228/176 |
| 2014/0272185 A1* | 9/2014 | Na | C23C 16/507 427/535 |
| 2015/0357165 A1 | 12/2015 | Takahashi | |
| 2016/0148789 A1* | 5/2016 | Chen | H01J 37/32357 134/1.2 |
| 2018/0143332 A1 | 5/2018 | Lea et al. | |
| 2019/0214262 A1 | 7/2019 | Yang et al. | |

FOREIGN PATENT DOCUMENTS

| | | |
|---|---|---|
| CN | 103003926 A | 3/2013 |
| CN | 104342632 A | 2/2015 |
| CN | 107093544 A | 8/2017 |
| CN | 109390197 A | 2/2019 |
| CN | 109698111 A | 4/2019 |
| WO | 2015018316 A1 | 2/2015 |

\* cited by examiner

PLASMA SYSTEM AND FILTER DEVICE

CROSS-REFERENCE TO RELATED APPLICATIONS

This application is a national phase entry under 35 U.S.C. § 371 of International Application No. PCT/CN2020/110414, filed on Aug. 21, 2020, which claims priority to Chinese Application No. 201910845812.9 filed Sep. 9, 2019, the entire contents of all of which are incorporated herein by reference.

TECHNICAL FIELD

The present disclosure generally relates to the semiconductor manufacturing field and, more particularly, to a plasma system and a filter device applied in the plasma system.

BACKGROUND

Conventionally, before performing processes such as deposition on a workpiece (e.g., a wafer), pre-cleaning is performed on the workpiece to remove impurities of the workpiece. A specific pre-cleaning process includes ionizing process gas such as argon, helium, hydrogen, etc., to form plasma, and free radicals of the plasma reacting with oxide impurities of the workpiece for a reduction-oxidation reaction to remove the impurities.

However, during the above-mentioned pre-cleaning process, ions from the plasma may have a negative impact on materials of the workpiece. For example, for low-k materials, if the plasma includes hydrogen ions, the hydrogen ions will enter the low-k materials, which results in degradation of the low-k materials. Thus, processing results do not meet the expectation.

SUMMARY

Embodiments of the present disclosure are intended to solve at least one of the technical problems in the existing technology and disclose a plasma system and a filter device, which can prevent ions from the plasma from negatively affecting material on the workpiece to improve product performance.

According to an embodiment of the present disclosure, a plasma system is disclosed. The plasma system includes a dielectric window, a first adapter, a lower electrode platform, and a filter device. An area surrounded by the dielectric window is set as a first chamber. The first chamber is configured to accommodate plasma. The first adapter is arranged under the dielectric window. An area surrounded by the first adapter is set as a second chamber. The lower electrode platform is placed in the second chamber. The lower electrode platform is used to carry a workpiece. The filter device includes a filter member, a first extension member, and a second extension member. The filter member is placed at an intersection of the first chamber and the second chamber. The filter member includes a plurality of through-holes configured to filter out ions from the plasma during a process that the plasma in the first chamber enters the second chamber through the through-holes. The first extension member extends from the filter member in a first direction and is placed over the first adapter. The second extension member extends from a position of the filter member adjacent to the first extension member to an inner side of the first adapter in a second direction and is configured to support the filter member. The second direction is perpendicular to the first direction.

The plasma system of the embodiment, with the filter member of the filter device, effectively filters out the ions from the plasma passed through in the process of the plasma in the first chamber entering the second chamber through the through-holes in the filter member. Thus, the ions may be prevented from entering low-k materials and causing degradation of the low-k material. In addition, by placing the first extension member of the filter device over the first adapter, the filter device is installed and positioned. By extending the second extension member to the inner side of the first adapter, the second extension member may support the filter member and protect the first adapter from being bombarded by the plasma. At the same time, since the filter device is integrally formed by the filter member, the first extension member, and the second extension member, no assembly gap exists among the filter member, the first extension member, and the second extension member. Under such a structure, the integrally formed filter device may prevent the plasma from bombarding the gap where elements are assembled. Thus, the replacement frequency of the filter device may be greatly reduced, thereby reducing the cost.

According to an embodiment of the present disclosure, a filter device applied to a plasma system is disclosed. The plasma system includes a dielectric window and an adapter arranged under the dielectric window. An area surrounded by the dielectric window is configured as a first chamber. The first chamber is configured to accommodate plasma. An area surrounded by the adapter is configured as a second chamber. The plasma system further includes a lower electrode platform placed in the second chamber. The lower electrode platform is used to carry a workpiece. The filter device includes a filter member, a first extension member, and a second extension member. The filter member is placed at an intersection of the first chamber and the second chamber. The filter member includes a plurality of through-holes and is configured to filter out ions from the plasma during the process that the plasma in the first chamber enters the second chamber through the through-holes. The first extension member extends from the filter member in a first direction and is placed over the first adapter. The second extension member extends from a position of the filter member adjacent to the first extension member to the inner side of the first adapter in a second direction and is configured to support the filter member. The second direction is perpendicular to the first direction.

The plasma system may effectively filter out the ions from the plasma passed through with the filter device of the embodiment, which prevents the ions from entering the low-k material to cause deterioration of the low-k material. In addition, by placing the first extension member of the filter device over the first adapter, the filter device may be installed and positioned. By extending the second extension member to the inner side of the first adapter, the second extension member can support the filter device and protect the first adapter from being bombarded by the plasma. At the same time, since the filter device is integrally formed by the filter member, the first extension member, and the second extension member, no assembly gap exists among the filter member, the first extension member, and the second extension member. Under such a structure, the integrally formed filter device can prevent the plasma from bombarding the gap where elements are assembled. Thus, the replacement frequency of the filter device may be greatly reduced, thereby reducing the cost.

DETAILED DESCRIPTION OF THE EMBODIMENTS

Figure 1:
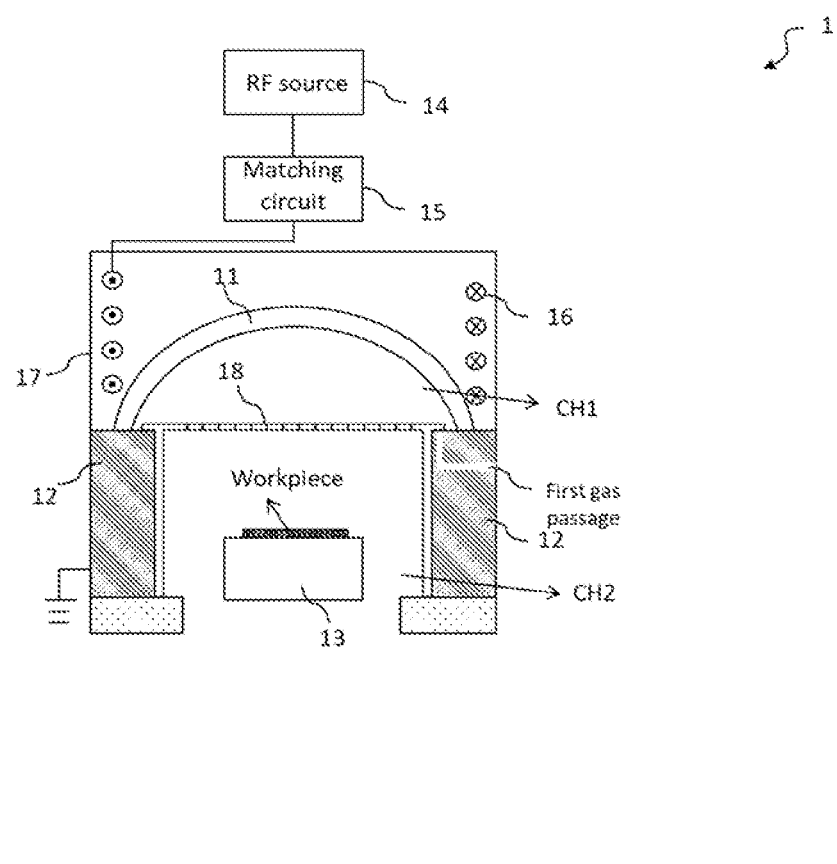
FIG. 1 is a schematic diagram of a plasma system according to an embodiment of the present disclosure.

The following disclosure provides various embodiments or examples, which can be used to implement various features of the present disclosure. Specific examples of components and configurations described below are used to simplify the present disclosure. It can be noted, these descriptions are only exemplary and are not intended to limit the present disclosure. For example, in the following description, forming a first feature on or over a second feature may include, in some embodiments, the first and second features being in direct contact with each other, and in some embodiments, an additional assembly being formed between the first and second features, such that the first and second features are not in the direct contact with each other. In addition, in embodiments of the present disclosure, reference numerals and/or marks may be reused. Such reuse is for brevity and clarity, and does not represent a relationship between different embodiments and/or configurations discussed.

Further, spatially relative terms, such as "below," "under," "lower," "above," "over," and the like, may be used to facilitate the description of a relationship between an assembly or feature shown in the drawings and another or a plurality of assemblies or features. These spatially relative terms are intended to cover various orientations of the device in use or operation in addition to the orientation shown in the drawings. The device may be placed in another orientation (e.g., rotated 90° or at other orientations). These spatially relative terms should be interpreted accordingly.

Although a numerical range and a parameter used to set forth a broader scope of the present disclosure are approximate values, related values of specific embodiments have been presented as precisely as possible. However, any value inherently contains a standard deviation resulting from an individual test method. As used herein, "about" generally means that an actual value is within plus or minus 10%, 5%, 1%, or 0.5% of a particular value or range. Alternatively, the word "about" means that the actual value lies within an acceptable standard error of the mean, which can be determined by those of ordinary skill in the art of the present disclosure. It can be understood that, in addition to experimental examples, or unless otherwise specified, all ranges, quantities, values, and percentages used here (for example, to describe an amount of material, time length, temperature, operation condition, quantity ratio, and the like) are decorated by "about." Therefore, unless otherwise specified to the contrary, the numerical parameters disclosed in the specification and the accompanying claims are approximate values and may be changed as needed. These numerical parameters should be at least understood as the indicated significant digits and values obtained by applying ordinary rounding. The numerical range is represented herein as from one endpoint to the other endpoint or between the endpoints. Unless otherwise specified, the numerical range described here includes the endpoints.

When a workpiece (such as a wafer) is processed, especially when processes of through-silicon via and packaging are performed on the workpiece, a pre-cleaning chamber may be required. A function of the pre-cleaning chamber may include removing impurities of a surface of a to-be-processed workpiece to facilitate an effective subsequent physical vapor deposition process. In a general pre-cleaning chamber, gases, such as argon, helium, hydrogen, etc., may be excited into plasma. The process of removing the impurities of the workpiece may be realized by using the plasma to physically bombard the impurities and chemically react with the impurities. For some oxide impurities, the plasma needs to be subject to a reduction-oxidation reaction with the oxide impurities at trenches or holes of the workpiece to remove the oxide impurities. Thus, the performance of the subsequent metal deposition process may not be affected. However, because some ions (such as hydrogen ions) may easily enter into the low-k material and degrade the low-k material to cause a process result not to meet the expectation, the hydrogen ions need to be prevented from such reaction. The embodiment discloses plasma system and a filter device applied to the plasma system, which can effectively reduce the reaction between the ions (e.g., hydrogen ions) and the low-k materials so as to avoid the above situation.

FIG. 1 is a schematic diagram of plasma system 1 according to an embodiment of the present disclosure. The plasma system 1 may include a pre-cleaning device and may be configured to react and remove impurities such as oxides in the trenches or the holes of the workpiece (e.g., the wafer). The plasma system 1 includes a dielectric window 11, a first adapter 12, a lower electrode platform 13, a radio frequency (RF) source 14, a matching circuit 15, an induction coil 16, a metal barrel 17, and a filter device 18. An area surrounded by the dielectric window 11 is set as a first chamber CH1. In the embodiment, the dielectric window 11 is illustrated in a hemispherical shape, however, the shape is not limited according to the embodiments of the present disclosure. In other embodiments, the dielectric window 11 may be in a different shape. Other changes regarding the dielectric window 11 may be explained in subsequent description. The first adapter 12 is arranged under the dielectric window 11 and is grounded. An area surrounded by the first adapter 12 is set as a second chamber CH2. In the embodiment, the plasma system 1 may fill the reaction gas (such as helium, argon, hydrogen, etc.) into the first chamber CH1 in a side inletting method. For example, a first gas passage may be arranged in the first adapter 12 and configured to transfer the reaction gas into the first chamber CH1.

The lower electrode platform 13 is arranged in the second chamber CH2 and configured to carry the workpiece. In some embodiments, the lower electrode platform 13 may be an electrostatic chuck, which can individually adjust temperatures of different positions of the workpiece by using a multi-zone heating method to improve the temperature uniformity of the workpiece.

The RF source 14 may apply RF power to the induction coil 16 through the matching circuit 15. The matching circuit 15 may be configured to adjust and match an impedance behind the matching RF source 14, so that the loaded RF power may achieve the maximum coupling efficiency. The induction coil 16 may be in a barrel shape and surround the dielectric window 11, for example, a cylindrical three-dimensional helical coil. In some embodiments, in order to achieve better uniformity and symmetry of electromagnetic field distribution, the induction coil 16 may be a cylindrical three-dimensional helical coil with more than 2 turns of coils. Each turn of the coil includes of a horizontal segment of ¾ circumference and a spiral rising segment of ¼ circumference. A higher end of the spiral rising segment may be connected to one end of the horizontal segment of the adjacent and higher one-turn coil. The induction coil 16 is configured to couple the RF power into the first chamber CH1, and ionizing and coupling the reaction gas in the first chamber CH1 into plasma. The metal barrel 17 is disposed over the first adapter 12 and surrounds the induction coil 16, and the metal barrel 17 is in contact with the first adapter 12 to achieve grounding and electromagnetic shielding.

Figure 2:
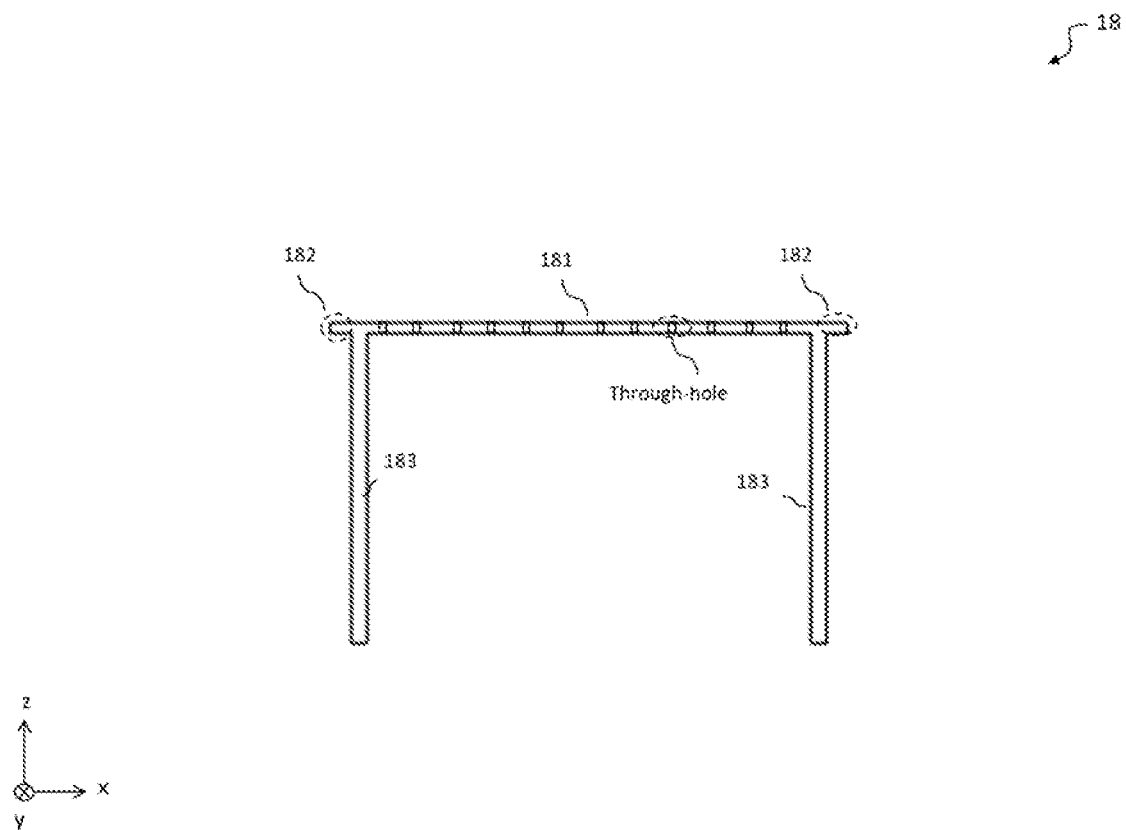
FIG. 2 is a schematic diagram of a filter device according to an embodiment of the present disclosure.

The filter device 18 has an integral structure. The filter device 18 may include a conductive material. That is, the filter device 18 is made of a conductive material. In certain embodiments, the filter device 18 may be made of aluminum. The filter device 18 may be realized by the integral structure that can avoid the gap where the plasma bombards the elements to greatly reduce the replacement frequency of the filter device 18, and further reduce the cost. Referring to FIGS. 1 and 2 at the same time, the filter device 18 includes a filter member 181, a first extension member 182, and a second extension member 183. The filter member 181 is arranged at the intersection of the first chamber CH1 and the second chamber CH2 to isolate the first chamber CH1 and the second chamber CH2. The filter member 181 may have a plurality of through-holes. Two ends of the through-holes may communicate with the first chamber CH1 and the second chamber CH2. Thus, the plasma in the first chamber CH1 can enter the second chamber CH2 through the through-holes. At the same time, the filter member 181 may be configured to filter out ions of the plasma passing through the through-holes. The plurality of through-holes of the filter member 181 may filter out the ions of the plasma (e.g., argon ions, helium ions, hydrogen ions, etc.) to prevent the ions from entering the second chamber CH2 to react with the workpiece on the lower electrode platform 13. Thus, the workpiece may be degraded, and the processing results of the subsequent processing may not meet the expectation.

In some embodiments, an arrangement density of the plurality of through-holes of the filter member 181 may be within a range of 0.7 through-holes/square centimeter to 3 through-holes/square centimeter. The arrangement density of the through-holes may be changed according to the speed of the process efficiency. In detail, when a higher requirement is applied to the process rate, the arrangement density of the through-holes may be appropriately increased, and vice versa.

Figure 3A:
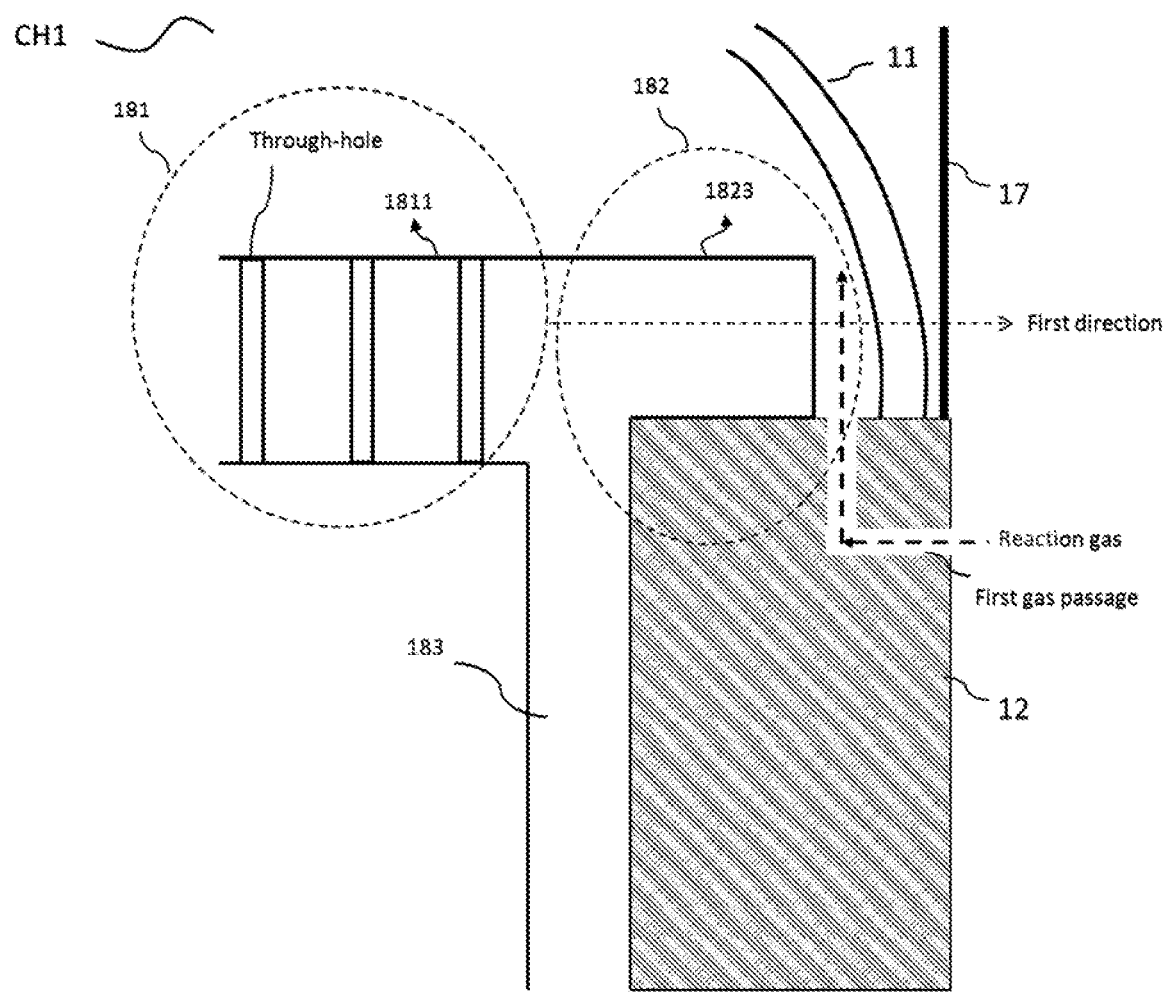
FIGS. 3A and 3B are detailed structural diagrams showing a first extension member of the filter device according to an embodiment of the present disclosure.
Figure 3B:
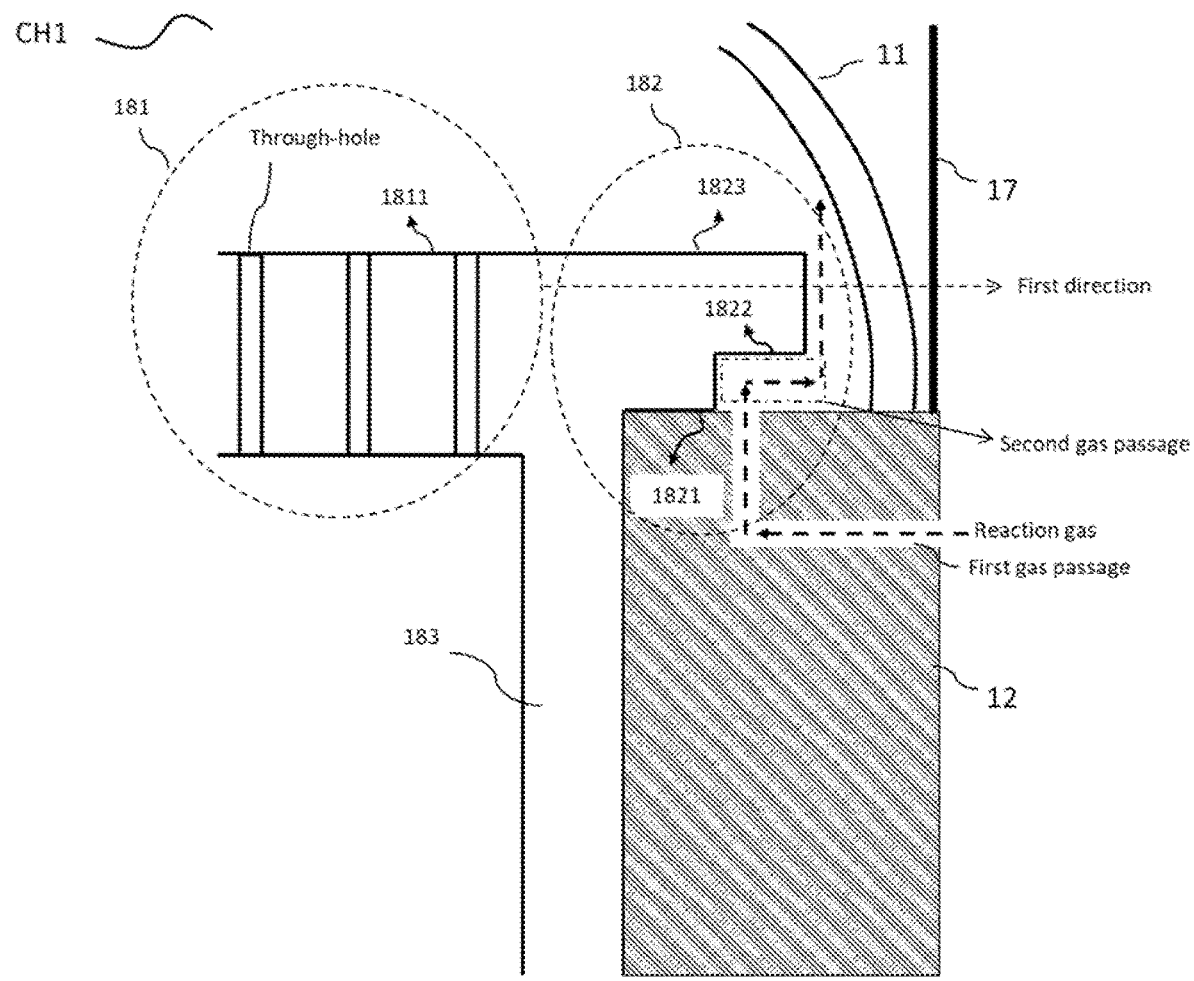

FIGS. 3A and 3B illustrate detailed structural diagrams of the first extension member 182 according to an embodiment of the present invention. As shown in FIG. 3A, the first extension member 182 extends from the filter member 181 in the first direction and is placed over the first adapter 12 to be in contact with the first adapter 12 to form a good grounding. For example, the first extension member 182 extends from the circumferential side surface of the filter member 181 in the first direction shown in FIGS. 3A and 3B. The extended part overlaps the upper end surface of the first adapter 12 to realize a conductive contact.

In addition, as shown in FIG. 3A, the first adapter 12 is provided with a first gas passage. The first gas passage is connected to an external reaction gas source (not illustrated in the figure). A gas outlet end of the first gas passage is located on the upper surface of the first adapter 12 and is located at a position between the first extension member 182 and the dielectric window 11 to communicate with the inside of the first chamber CH1. The reaction gas (such as helium, argon, hydrogen, etc.) may directly enter the first chamber CH1 through the gas passage. The reaction gas entering the first chamber CH1 may be ionized to form the plasma. The plasma in the first chamber CH1 may enter the second chamber CH2 through the through-holes. At the same time, the filter member 181 may filter out the ions from the plasma passing through the through-holes to prevent the ions from entering the second chamber CH2 to react with the workpiece and degrade the workpiece, the process results of the subsequent processing thus may not meet the expectation. However, the gas inlet method is not a limitation of the embodiment.

Referring to FIG. 3B, the structure of the first extension member 182 shown in FIG. 3B is different from the structure of the first extension member in FIG. 3A. Except for the first extension member, other structures are the same, which are not repeated here. In FIG. 3B, a portion of the first extension member 182 is attached to the upper surface of the first adapter 12. The remaining portion is arranged above the first adapter part 12 at an interval. The first extension member 182 may be in a stepped structure, for example, including a first lower surface 1821 and a second lower surface 1822. The first lower surface 1821 is arranged over the first adapter 12 and is attached to the upper surface of the first adapter 12 to form a good grounding. The second lower surface 1822 is located on a side of the first lower surface 1821 away from the filter member 181. The position of the second lower surface 1822 in an axial direction of the filter member 181 is higher than the position of the first lower surface 1821 in the axial direction of the filter member 181. Thus, an interval between the second lower surface 1822 and the upper surface of the first adapter 12 may form a second gas passage configured to let the gas to pass through. Specifically, as shown in FIG. 3B, the first adapter 12 is provided with the first gas passage. The first gas passage is connected to the external reaction gas source (not shown). The gas outlet end of the first gas passage is located on the upper surface of the first adapter 12 and is opposite to the second lower surface 1822. The second lower surface 1822 and the first adapter 12 form the second gas passage. Specifically, the interval between the second lower surface 1822 and the upper surface of the first adapter 12 may be the second gas passage. The second gas passage may communicate with the gas outlet end of the first gas passage. With such an arrangement, the reaction gas may enter the first chamber after passing through the first gas passage and the second gas passage. At the same time, the first extension member 182 may shield the gas outlet end of the first gas passage well, thereby reducing and even preventing the plasma from entering the first gas passage.

In some embodiments, the upper surface 1823 of the first extension member 182 may be coplanar with the upper surface 1811 of the filter member 181, which is beneficial to improve the uniformity of gas distribution.

Figure 4A:
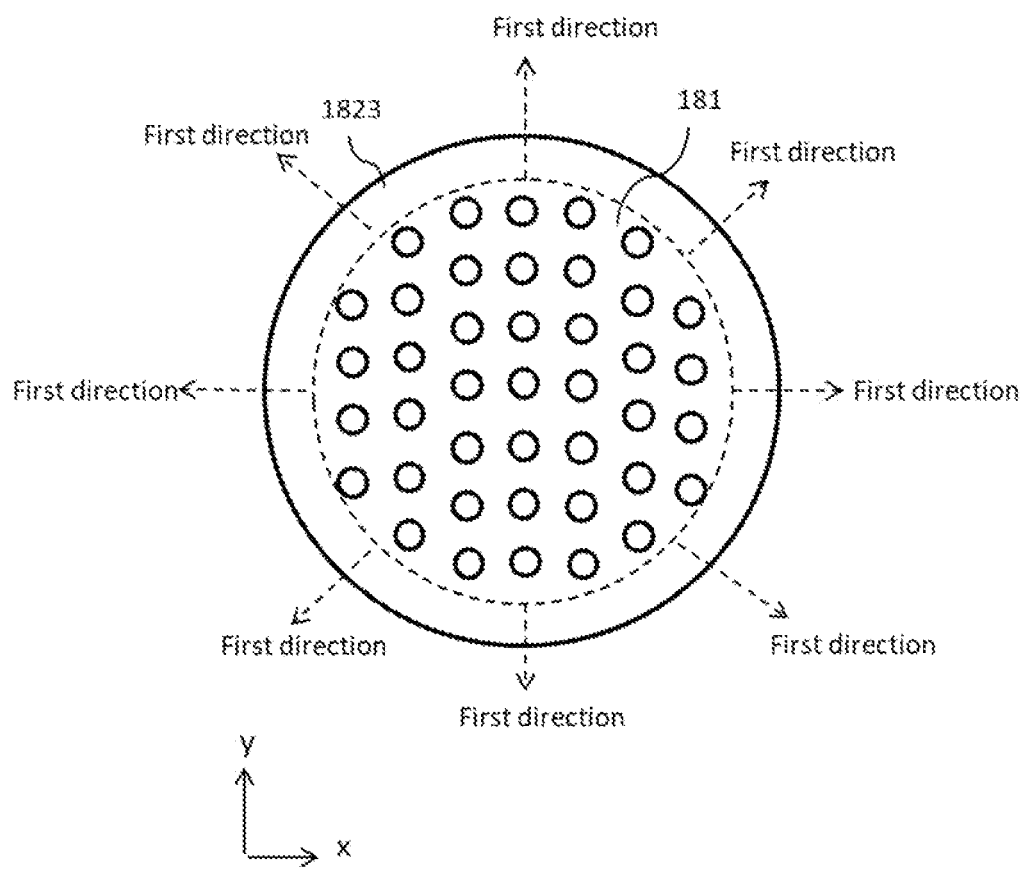
FIGS. 4A and 4B are top views showing the first extension member of the filter device according to an embodiment of the present disclosure.

The first extension member 182 may have various structures. For example, FIG. 4A is a top view of the first extension member 182 according to an embodiment of the present disclosure. As shown in FIG. 4A, the first extension member 182 extends from the edge of the filter member 181 in the first direction to form an annular structure. The ring structure surrounds along in the circumferential direction of the filter member 181. In this case, the upper surface 1823 of the first extension member 182 forms the ring structure in the top view. The extension direction of the first extension member 182 of the ring structure is the first direction shown in FIG. 4A. That is the direction along a radial direction of the filter member 181 and away from a central axis of the filter member 181.

Figure 4B:
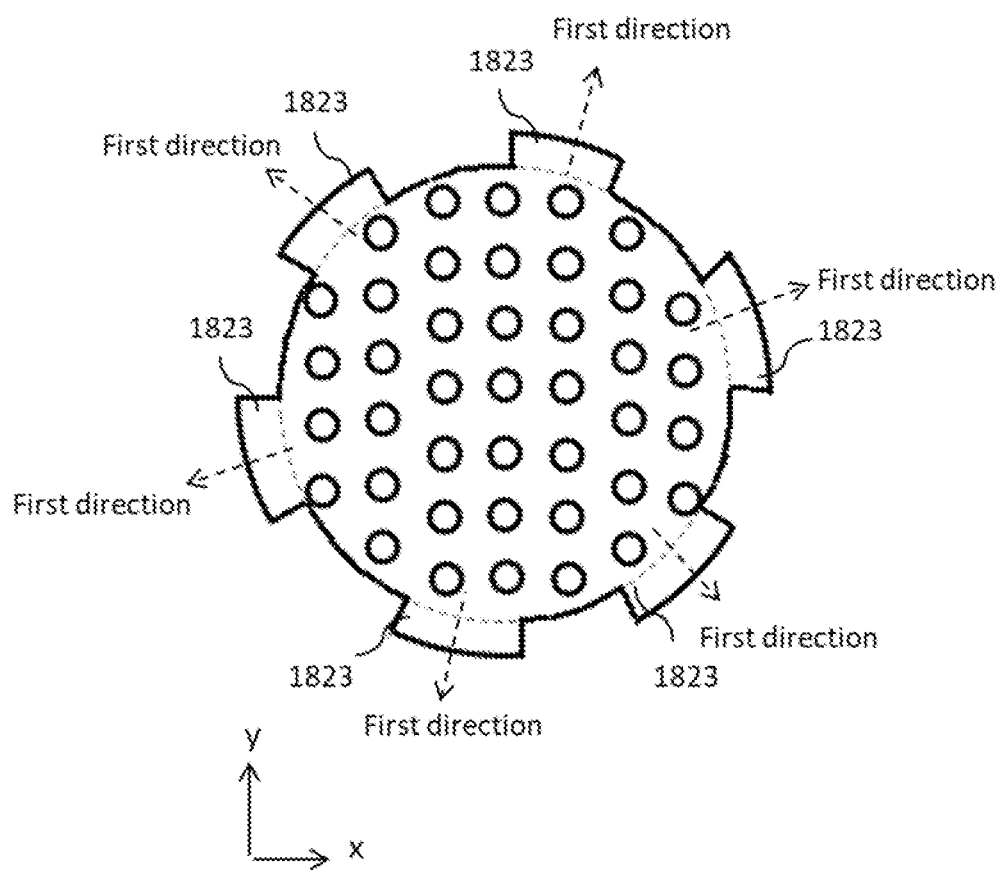

For another example, FIG. 4B is a top view of the first extension member 182 according to another embodiment of the present disclosure. Referring to FIG. 4B, a plurality of the first extension members 182 are included and arranged at intervals along the circumferential direction of the filter member 181. Each first extension member 182 may extend from the edge of the filter member 181 in the first direction to form a protrusion structure. In this case, each upper surface 1823 of the first extension member 182 may form a protrusion structure, such as a protrusion shape or a claw shape, in a top view. The extending direction of the protrusion structure is the first direction shown in FIG. 4B. That is the direction along the radial direction of the filter member 181 and away from the central axis of the filter member 181.

Those of ordinary skill in the art should be able to easily understand after reading embodiments of FIGS. 4A and 4B that the first extension member 182 may also use any other structure, as long as the filter device 18 can be stably arranged over the first adapter 12 and form a good grounding.

Figure 5A:
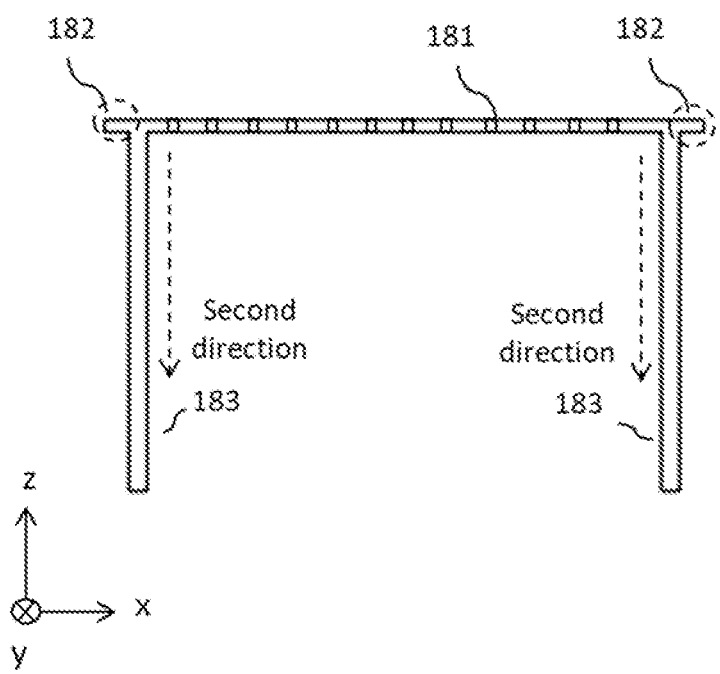
FIGS. 5A and 5B are side views showing a second extension member of the filter device according to an embodiment of the present disclosure.
Figure 5B:
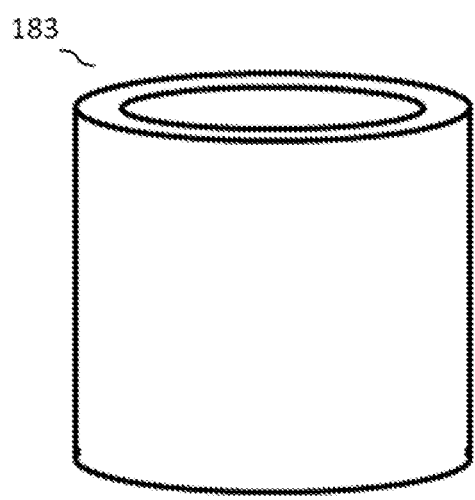

Referring to FIG. 5A and in connection with FIG. 1, the second extension member 183 extends from the position of the filter member 181 neighboring to the first extension member 182 in the second direction to the inner side of the first adapter 12 and may be configured to support the filter member 181. At the same time, the second extension member 183 may further be used as an inner lining to protect the first adapter 12 from being bombarded by the plasma. Thus, the service life of the first adapter 12 can be extended, and the plasma can be prevented from bombarding the first adapter 12 to form particles to contaminate the workpiece on the lower electrode platform 13. Specifically, the above-mentioned second direction is perpendicular to the first direction. For example, as shown in FIG. 5A, the second extension member 183 extends downward along the axial direction of the filter member 181. As shown in FIG. 5B, the second extension member 183 may have a barrel structure and surrounds along the circumferential direction of first adapter piece 12.

Figure 6A:
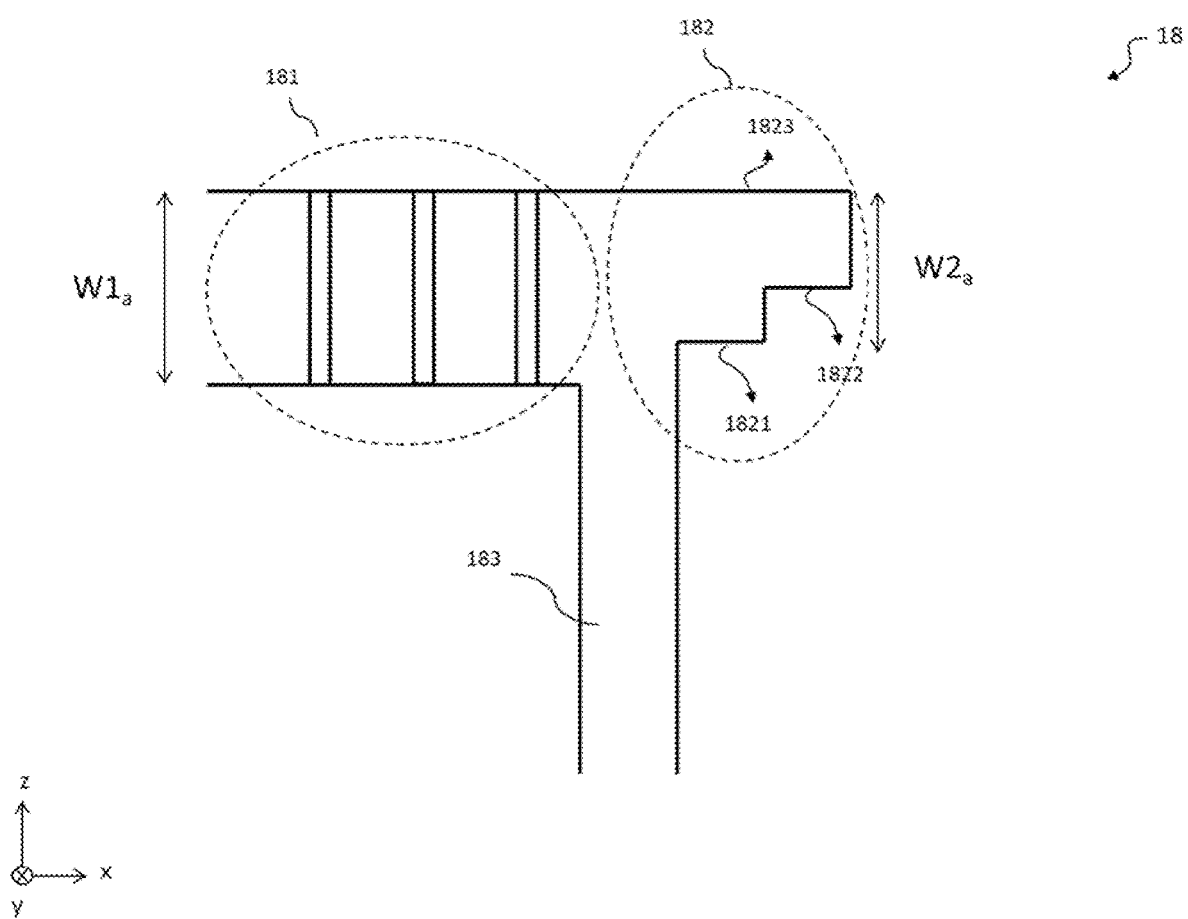
FIGS. 6A to 6C are schematic diagrams showing thicknesses of a filter member and the first extension member of the filter device according to an embodiment of the present disclosure.
Figure 6B:
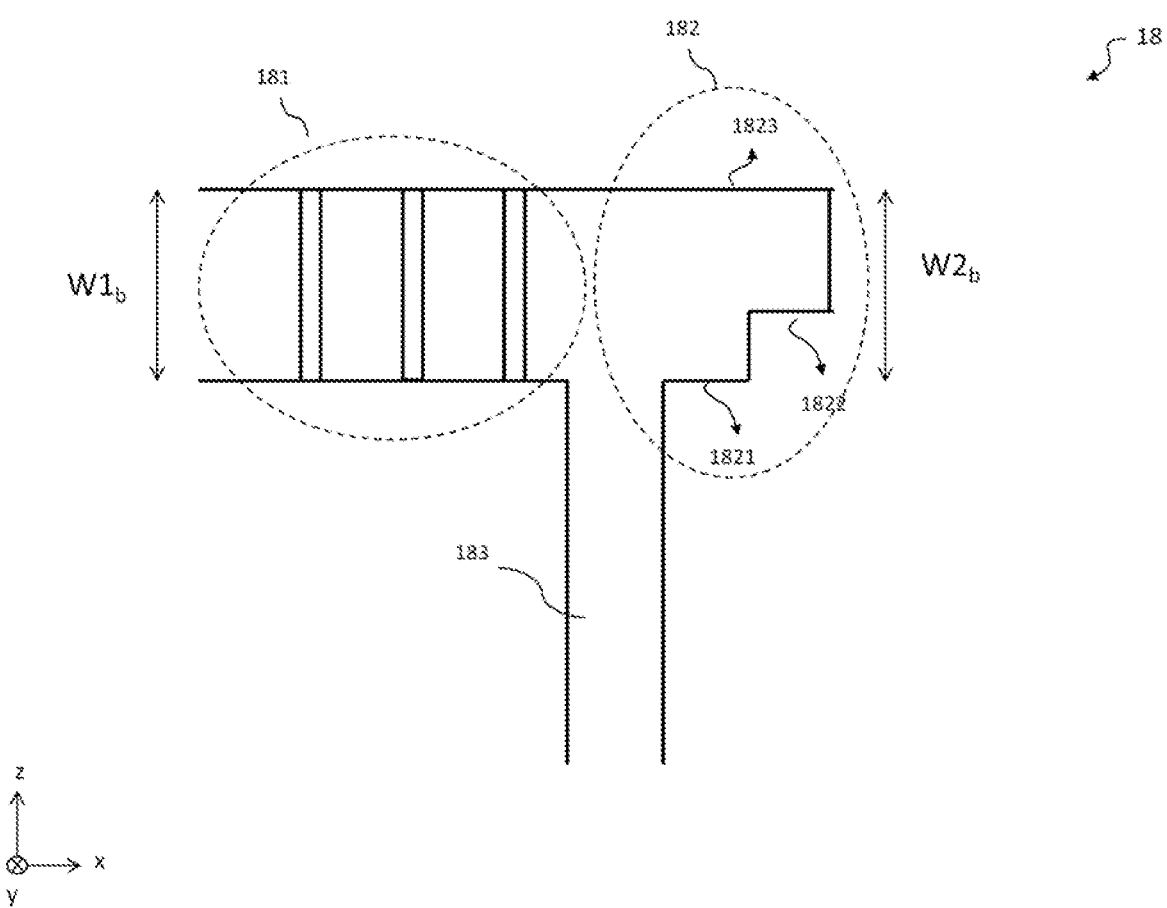
Figure 6C:
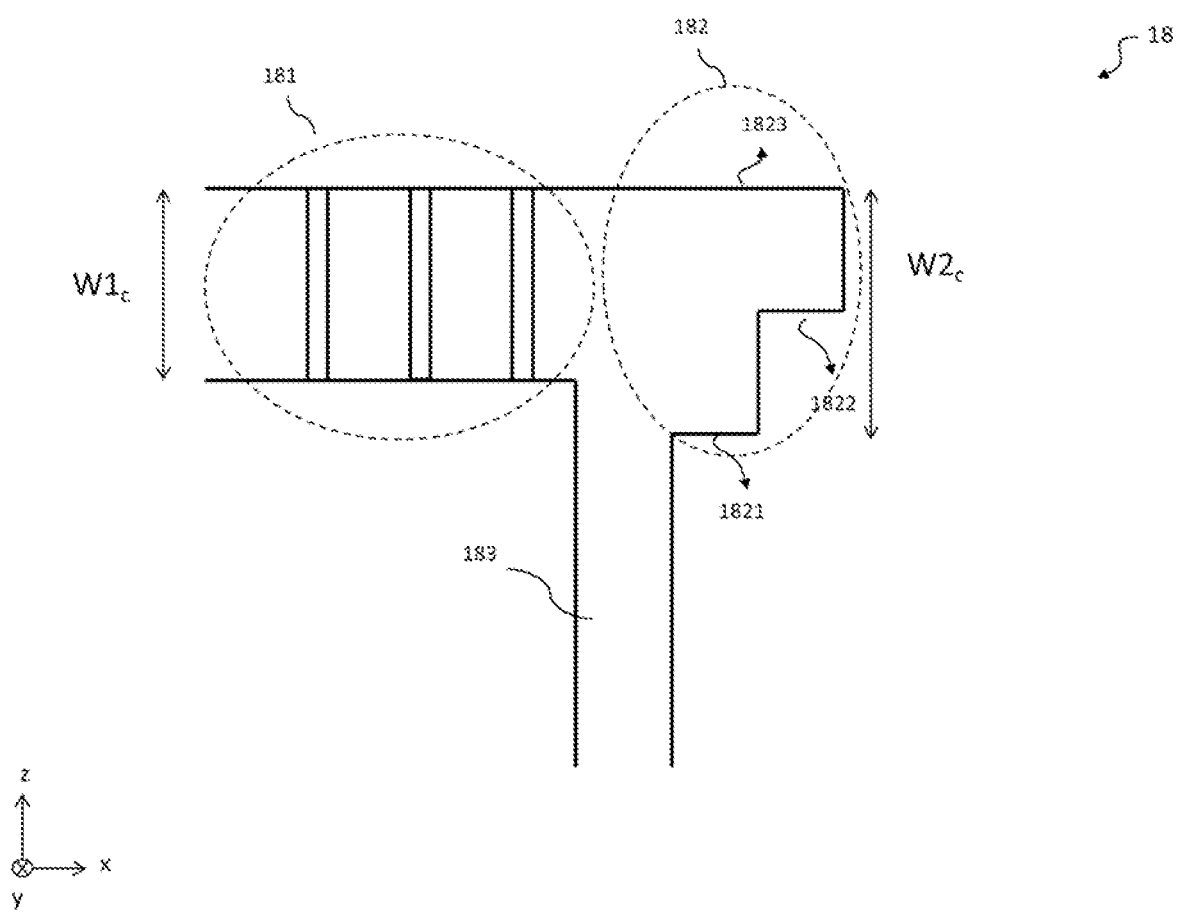

In some embodiments, different positions of the filter member 181 may have the same thickness in the axial direction. FIGS. 6A to 6C use the structure shown in FIG. 3B as an example. FIG. 6A is a detailed structural diagram of a filter device 18 according to an embodiment of the present disclosure. As shown in FIG. 6A, the thickness of the different positions of the filter member 181 in the axial direction is equal to thickness W1$a$. A thickness of the first extension member 182 in the axial direction of the filter member 181 (i.e., the interval between the upper surface 1823 and the first lower surface 1821) is equal to thickness W2$a$. Thickness W1$a$ is greater than thickness W2$a$, however, which is not a limitation of embodiments of the present disclosure. In some embodiments, the thickness of the filter member 181 in the axial direction may be less than or equal to the thickness of the first extension member 182 in the axial direction of the filter member 181. As shown in FIG. 6B, the thickness of different positions of the filter member 181 in the axial direction is equal to thickness W1$b$. The thickness of the first extension member 182 in the axial direction of the filter member 181 (i.e., the interval between the upper surface 1823 and the first lower surface 1821) is equal to thickness W2$b$. Thickness W1$b$ is equal to thickness W2$b$. In addition, as shown in FIG. 6C, the thickness of different positions of the filter member 181 in the axial direction is equal to thickness W1$c$. The thickness of the first extension member 182 in the axial direction of the filter member 181 (i.e., the interval between the upper surface 1823 and the first lower surface 1821) is equal to thickness W2$c$. Thickness W1$c$ is smaller than thickness W2$c$.

Those skilled in the art should be able to easily understand after reading the embodiments in FIGS. 6A to 6C that embodiments of the present disclosure do not limit the relative relationship of the thicknesses of the filter member 181 and the first extension member 182 in the axial direction of the filter member 181. As long as the first extension member 182 can be placed over the first adapter 12 and form a good grounding to realize the shield function, it should belong to the scope of the present disclosure.

As mentioned above, in some embodiments, the thickness of different positions of the filter member 181 may be the same in the axial direction. In this design, a ratio of a through-hole depth of the filter member 181 to a through-hole diameter may range from 2 to 20. Preferably, the through-hole depth of the filter member 181 may be 10 mm, and the through-hole diameter may be 1 mm. In other words, the ratio of the through-hole depth to the through-hole diameter is 10. Preferably, the through-hole depth of the filter member 181 may be 7 mm, and the through-hole diameter may be 0.5 mm. In other words, the ratio of the through-hole depth to the through-hole diameter is 14. Preferably, the through-hole depth of the filter member 181 may be 7 mm, and the through-hole diameter may be 1 mm. In other words, the ratio of the through-hole depth to the through-hole diameter is 7. The above-mentioned through-hole sizes are all smaller than plasma sheath, so that after the plasma of the first chamber CH1 passes through the through-holes of the filter member 181, a large number of ions from the plasma cannot pass through. Therefore, the filter device 18 of embodiments of the present disclosure can effectively filter out the ions. Thus, free radicals, atoms, and molecules may process the workpiece in the second chamber CH2, which avoids the reaction between the ions and the workpiece to cause the process result not to meet the expectation.

Figure 7A:
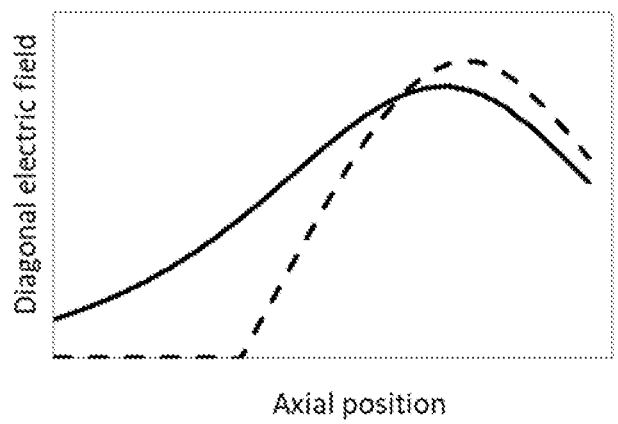
FIGS. 7A to 7F are simulation result diagrams according to an embodiment of the present disclosure.

Applicants have simulated various conditions of the filter device 18 to obtain a device specification that are most effective in filtering the ions. It should be noted that, as shown in FIGS. 7A to 7F, an axial position is a position upward from the lower electrode platform 13, and a radial position is a position from the center axis of the lower electrode platform 13 outward to the edge. FIG. 7A shows the simulation of the electric field distribution in the plasma system 1 with and without the filter device 18. The solid line in FIG. 7A represents the electric field distribution when the filter device 18 is not installed in the plasma system 1. The dotted line represents the electric field distribution when the filter device 18 is installed in the plasma system 1. It can be clearly observed from FIG. 7A that the plasma system 1 with the filter device 18 installed effectively shields the diagonal electric field. In detail, when the filter device 18 is installed, the diagonal electric field can be effectively shielded within a certain distance from the lower electrode platform 13 to an upper portion of the lower electrode platform 13.

Figure 7B:
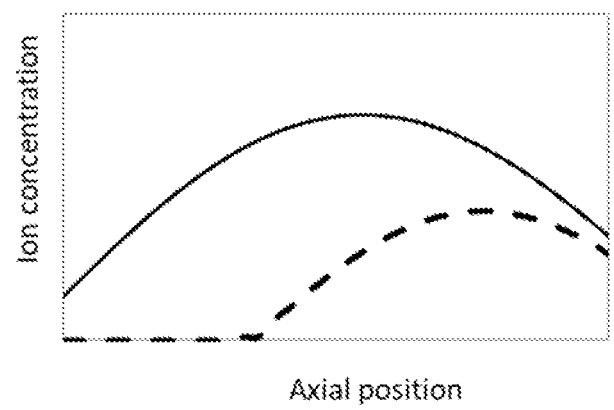

FIG. 7B shows simulations of ion concentration distribution in the plasma system 1 with or without the filter device 18. In FIG. 7B, the solid line represents the ion concentration distribution above the lower electrode platform 13 when the filter device 18 is not installed in the plasma system 1. The dotted line represents the ion concentration distribution above the lower electrode platform 13 when the filter device 18 is installed in the plasma system 1. It can be clearly observed from FIG. 7B that, compared with the case that the filter device 18 is not installed, the plasma system 1 with the filter device 18 installed can effectively filter the ions.

Figure 7C:
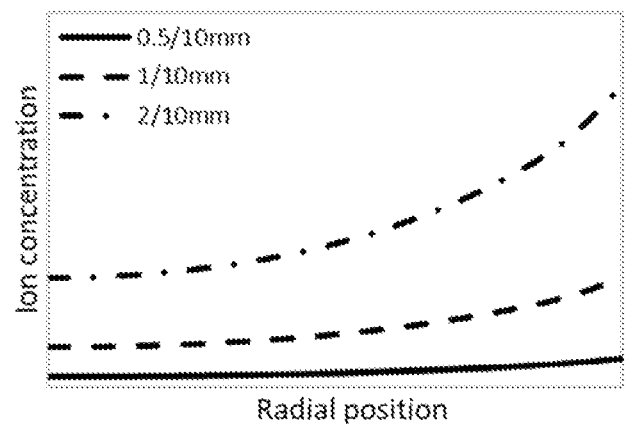

FIG. 7C shows simulations of ion concentration distribution when the through-holes of the filter member 181 have the same depth but different diameters. In detail, in the simulations shown in FIG. 7C, the measurement is performed at a certain fixed position above the lower electrode platform 13 (e.g., the position of the workpiece). In addition, in the simulations shown in FIG. 7C, the through-hole depths of the filter member 181 is fixed at 10 mm, and the simulations are performed with the through-hole diameter being 0.5 mm, 1 mm, and 2 mm, respectively. It can be clearly observed from FIG. 7C that the smaller the through-hole diameter is, the lower the ion concentration is at the fixed position. In other words, the smaller the through-hole size is, the more ions can be filtered out to be prevented from reacting with the workpiece.

Figure 7D:
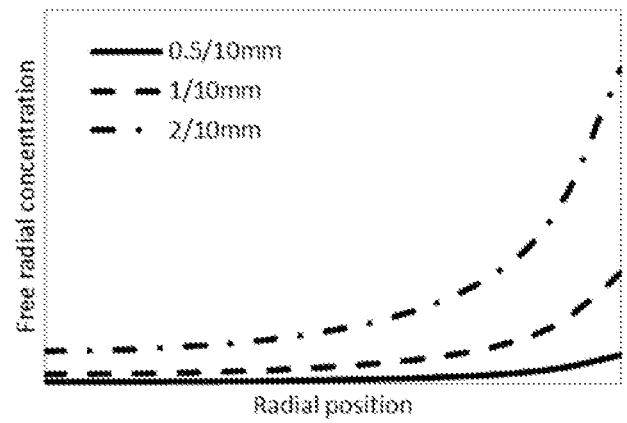

FIG. 7D shows simulations of free radical concentration distribution when the through-holes of the filter member 181 have the same depth but different diameters. In detail, in the simulations shown in FIG. 7D, the measurement is performed at a certain fixed position above the lower electrode platform 13 (e.g., the position of the workpiece). In addition, in the simulations shown in FIG. 7D, the through-hole depth of the filter member is fixed at 10 mm, and the simulations were performed for the through-hole diameters of 0.5 mm, 1 mm, and 2 mm, respectively. It can be clearly observed from FIG. 7D that the smaller the through-hole diameter is, the more consistent the free radical concentration is in the radial direction of the lower electrode platform 13. In other words, the smaller the through-hole diameter, the better the uniformity of free radical concentration is.

Figure 7E:
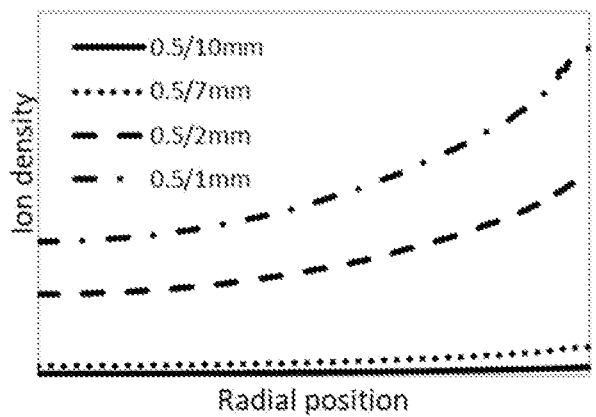

FIG. 7E shows simulations of the ion density distribution when the through-holes of the filter member 181 have the same diameter but different depths. In detail, in the simulations shown in FIG. 7E, the measurement is performed at the certain fixed position above the lower electrode platform 13 (e.g., the position of the workpiece). In addition, in the simulations shown in FIG. 7E, the through-hole diameter is fixed at 0.5 mm, and the simulations are performed for the through-hole depths of 1 mm, 2 mm, 7 mm, and 10 mm, respectively. It can be clearly observed from FIG. 7E that the deeper the through-hole depth is, the lower the ion density is at the fixed position. In other words, the deeper the through-hole depth is, the more ions can be filtered out to be prevented from reacting with the workpiece.

Figure 7F:
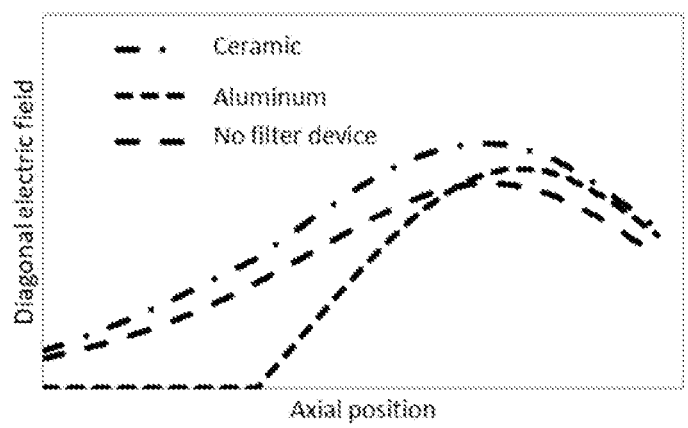

FIG. 7F shows simulations of electric field distribution when the filter device 18 is realized with different materials. More specifically, in the simulations shown in FIG. 7F, the simulations were performed when the filter device 18 is realized by ceramics and aluminum, and when the filter device 18 is not installed. It can be clearly observed from FIG. 7F that when the filter device 18 is realized with a ceramic material, similar to the case when the filter device 18 is not installed, the shield effect for the diagonal electric field is less significant. On the contrary, when the filter device 18 is realized with an aluminum material, the diagonal electric field can be effectively and completely shielded within a certain distance from the lower electrode platform 13 to a position above the lower electrode platform 13.

Figure 8:
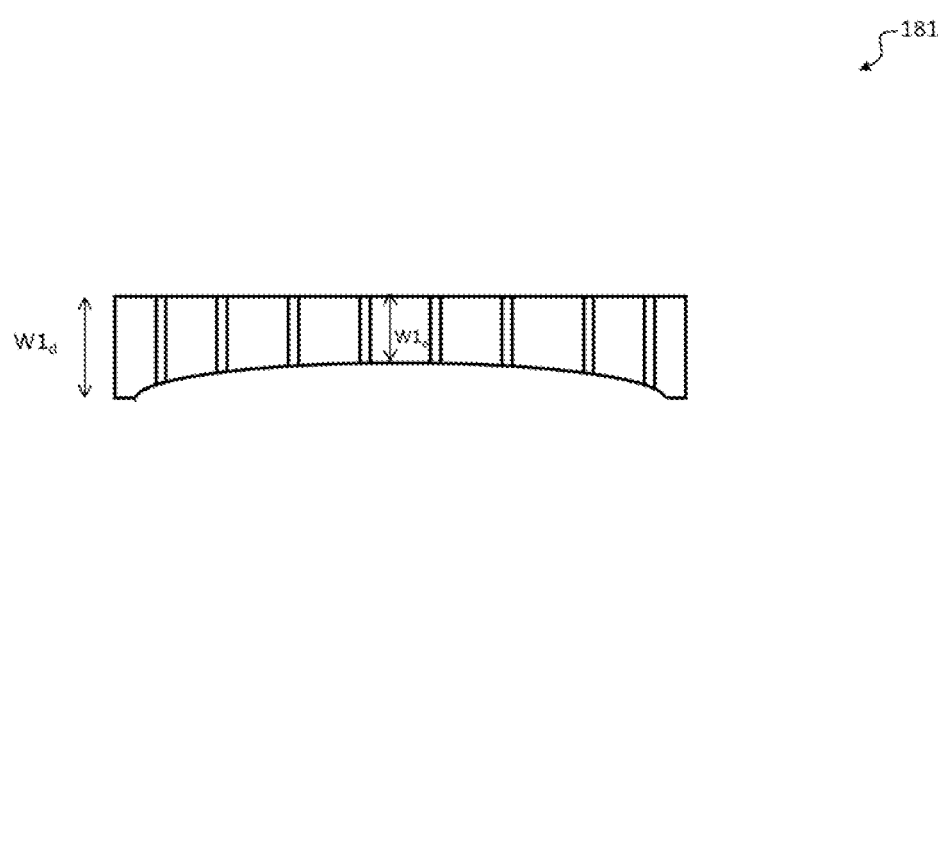
FIG. 8 is a side view of a filter member according to an embodiment of the present disclosure.

In some embodiments, the filter member 181 may be thicker at the edges than at the center. Referring to FIG. 8, FIG. 8 is a side view of the filter member 181 according to an embodiment of the present disclosure. The thickness of the filter member 181 at the edges is W1$d$, and the thickness of the filter member 181 at the center is W1$e$. Thickness W1$d$ is greater than thickness W1$e$. Preferably, the through-hole diameter of the filter member 181 may be 0.5 mm, and the through-hole depth may be gradually changed from 15 mm at the edge to 6 mm at the center. In other words, the ratio of the depth to the through-hole diameter of the filter member 181 may range from 12 to 30. Preferably, the through-hole diameter of the filter member 181 may be 1 mm, and the through-hole depth may be gradually changed from 18 mm at the edge to 8.5 mm at the center. In other words, the ratio of the depth to the through-hole diameter of the filter member 181 may range from 8.5 to 18.

Figure 9A:
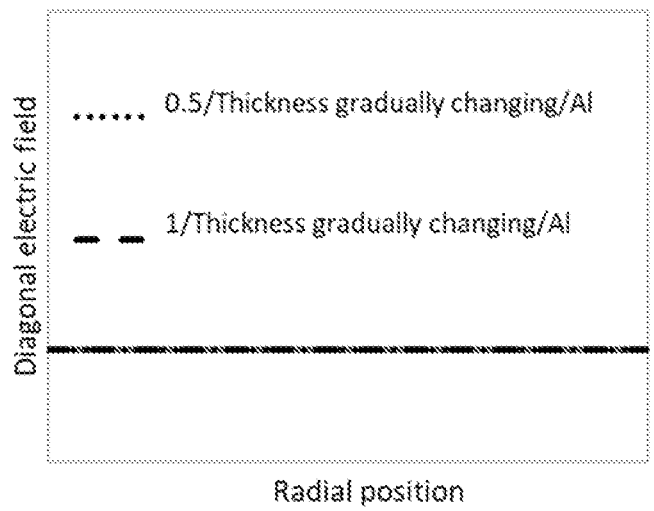
FIGS. 9A to 9C are simulation result diagrams according to an embodiment of the present disclosure.
Figure 9B:
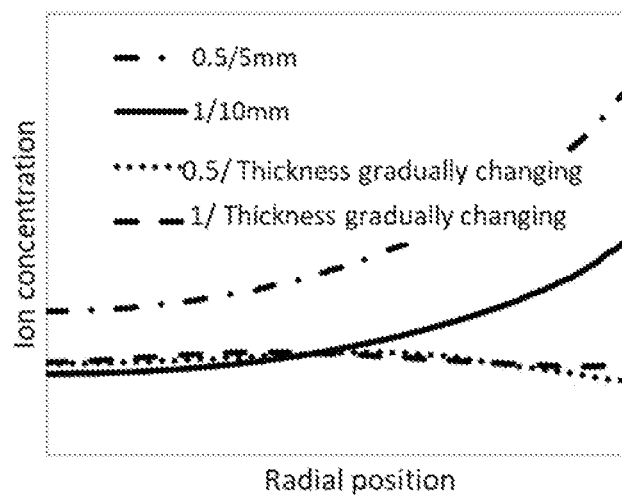
Figure 9C:
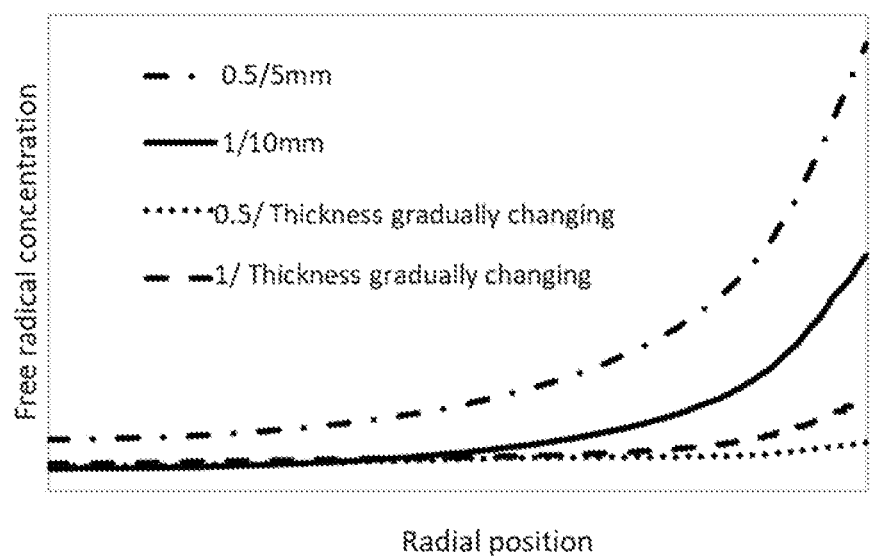

Applicants have performed simulations with various conditions of the filter device 18 to obtain the device specifications that are most effective in filtering the ions. As shown in FIGS. 9A to 9C, the axial position represents the position upward from the lower electrode platform 13, and the radial position represents the position from the center axis of the lower electrode platform 13 outward to the edge. FIG. 9A shows the simulations of the electric field distribution when the through-hole size of the filter member 181 is 0.5 mm and 1 mm, respectively, and the thickness is gradually changed. In detail, in the simulations shown in FIG. 9A, the measurement is performed at a certain fixed position above the lower electrode platform 13 (e.g., the position of the workpiece). It can be clearly observed from FIG. 9A, with the improved design that the thickness is gradually changed, the filter member 181 with the through-hole diameter of 0.5 mm or 1 mm can effectively and completely shield the diagonal electric field.

FIG. 9B shows the simulations of the ion concentration distribution when the through-hole diameter of the filter member 181 is 0.5 mm and 1 mm, respectively, and the thickness is fixed or is gradually changed. In detail, in the simulations shown in FIG. 9B, the measurement is performed at a certain fixed position above the lower electrode platform 13 (e.g., the position of the workpiece). It can be clearly observed from FIG. 9B that when the through-hole diameter of the filter member 181 is 0.5 mm, the ions can be filtered more effectively with the improved design that the thickness is gradually changed to be prevented from reacting with the workpiece. Similarly, when the through-hole diameter of the filter member 181 is 1 mm, with the improved design that the thickness is gradually changed, the ions can be filtered more effectively to be prevented from reacting with the workpiece.

FIG. 9C shows a simulation diagram for the free radical concentration distribution when the through-hole diameter of the filter member 181 is 0.5 mm and 1 mm, respectively, and the thickness is fixed or is gradually changed. In detail, in the simulations shown in FIG. 9C, the measurement is performed at a certain fixed position above the lower electrode platform 13 (e.g., the position of the workpiece). It can be clearly observed from FIG. 9C that when the through-hole diameter of the filter member 181 is 0.5 mm, with the improved design that the thickness is gradually changed, the uniformity of the free radical concentration may be improved more effectively in the radial direction of the lower electrode platform 13. Similarly, when the through-hole diameter of the filter member 181 is 1 mm, with the improved design that the thickness is gradually changed, the uniformity of the free radical concentration may be improved more effectively in the radial direction of the lower electrode platform 13.

According to the embodiments of FIGS. 7A to 7F and FIGS. 9A to 9C, it can be clearly observed that the filter device 18 of the present disclosure has a good shield effect on the RF electric field. Thus, the vacuum chamber can be divided into plasma generation area and plasma diffusion area. The filter device 18 made of the aluminum material can almost completely shield the diagonal electric field to prevent glow phenomenon below of the filter device 18 (i.e., the second chamber CH2). In addition, with the improved design by changing the ratio of the through-hole depth to the through-hole diameter of the filter member 181 and gradually changing the thickness of the filter member 181 from thicker at the edge to thinner at the center, the ion concentration above the lower electrode platform 13 may be reduced, and the uniformity of the free radicals in the radial direction of the lower electrode platform 13 may be improved.

It should be noted that, compared with the conventional plasma system, the plasma system 1 of embodiments of the present disclosure does not have a lower RF source and a matching circuit. Since the filter device 18 of the present disclosure can effectively reduce the ion concentration above the lower electrode platform 13, when there is no lower RF source and matching circuit, the free radicals may reach the workpiece on the lower electrode platform 13 in a diffusion method. As such, compared with the conventional plasma system, the plasma system 1 can reduce power consumption more effectively.

Figure 10:
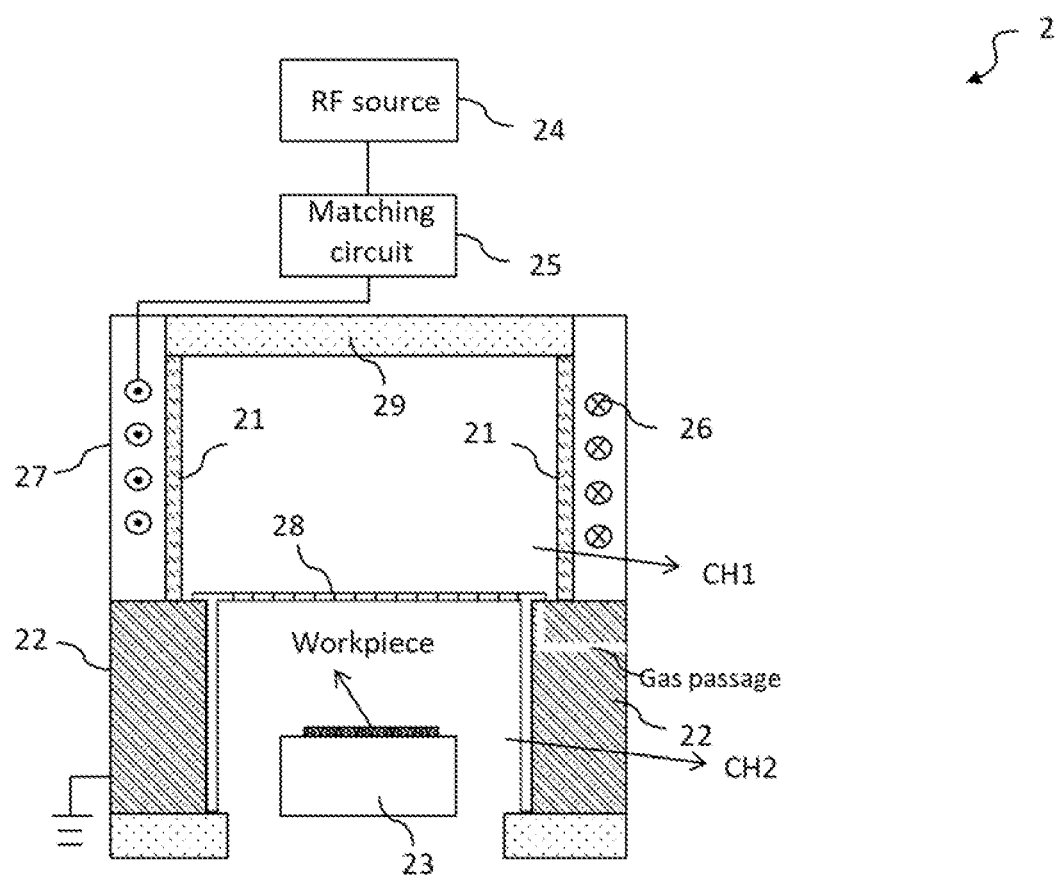
FIG. 10 is a side view of a plasma system according to another embodiment of the present disclosure.

The dielectric window 11 in the plasma system 1 may have a hemispherical shape, however, which is not a limitation of embodiments of the present disclosure. FIG. 10 is a side view of plasma system 2 according to an embodiment of the present disclosure. The plasma system 2 may process the workpiece by plasma. For example, the plasma system 2 may be a pre-cleaning device and configured to remove oxide impurities in the trenches or holes of the workpiece by performing an oxidization reaction on the oxide impurities. The plasma system 2 includes a dielectric window 21, a first adapter 22, a lower electrode platform 23, an RF source 24, a matching circuit 25, an induction coil 26, a metal barrel 27, a filter device 28, and a top cover 29. The plasma system 2 is substantially similar to the plasma system 1. The only difference exists in the dielectric window 21 and the top cover 29 of plasma system 2. In detail, unlike the dielectric window 11, which is hemispherical, the dielectric window 21 has a barrel-shaped structure and is arranged over the first adapter 22. In the embodiment, the dielectric window 21 may include an insulation material. For example, the dielectric window 21 may be made of materials such as quartz or ceramic. The top cover 29 is arranged above the dielectric window 21. In the embodiment, the top cover 29 may include a conductive material. For example, the top cover 29 may be made of aluminum. Those skilled in the art should be able to easily understand the functions and purposes of other assemblies in the plasma system 2 after reading the embodiments in FIGS. 1 to 9C. The detailed description is omitted here to save space.

Figure 11:
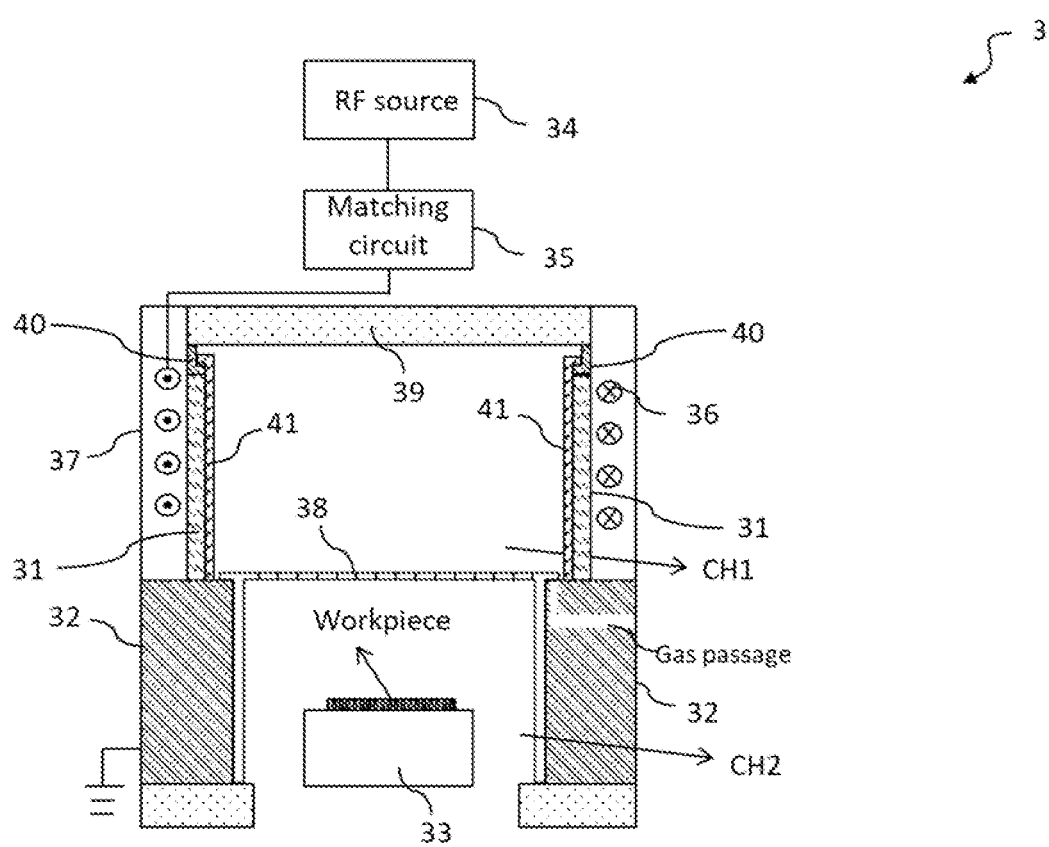
FIG. 11 is a side view of a plasma system according to yet another embodiment of the present disclosure.

FIG. 11 is a side view of plasma system 3 according to an embodiment of the present disclosure. The plasma system 3 may process the workpiece by plasma. For example, the plasma system 3 may be a pre-cleaning device configured to remove oxide impurities in trenches or holes of the workpiece by performing a reduction reaction on the oxide impurities. The plasma system 3 includes a dielectric window 31, a first adapter 32, a lower electrode platform 33, an RF source 34, a matching circuit 35, an induction coil 36, a metal barrel 37, a filter device 38, a top cover 39, a second adapter 40, and a shield 41. The plasma system 3 is substantially similar to the plasma system 2. The only difference includes that the plasma system 3 additionally includes a second adapter 40 and a shield 41. Structures, shapes, and functions of the second adapter 40 and the shield 41 are described in detail below.

Figure 12:
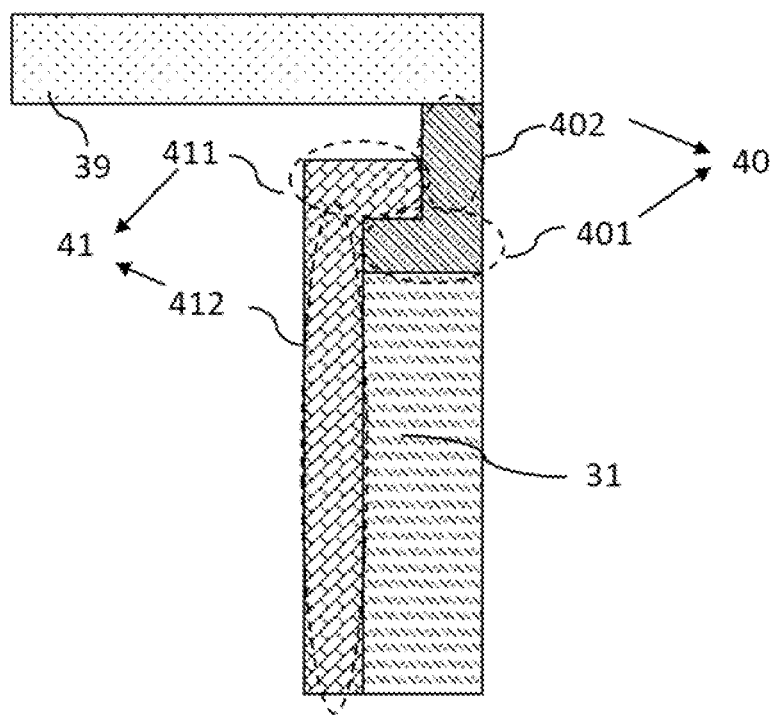
FIG. 12 is a side view showing an adapter and a shield according to an embodiment of the present disclosure.

Referring to FIG. 12, FIG. 12 is a side view of the second adapter 40 and the shield 41 according to an embodiment of the present disclosure. The second adapter 40 has an annular bottom 401 and an annular top 402. The annular bottom 401 represents an annular structure in a top view. The annular bottom 401 is arranged over the dielectric window 31 and protrudes oppositely to an inner peripheral wall of the annular top 402. An upper surface of the annular top 402 is attached to a lower surface of the top cover 39. In other words, the top cover 39 is arranged on the second adapter 40.

The shield member 41 includes an annular main body 412 and an annular extension member 411. The annular main body 412 surrounds at an inner side of the dielectric window 31 along a circumferential direction of the dielectric window 31. The annular extension member 411 may represent an annular structure in a top view. The annular extension member 411 extends from the annular main body 412 and is arranged over the annular bottom 401. Specifically, the annular extension member 411 extends from an outer peripheral wall of the annular main body 412 along a radial direction of the annular main body 412. The extended portion overlaps the portion of the annular bottom 401 protruding from the inner peripheral wall of the annular top 402 to fix the shield member 41. By surrounding the annular main body 412 at the inner side of the dielectric window 31 along the circumferential direction of the dielectric window 31, the represented barrel-like structure may form a good grounding and a Faraday shield barrel. Thus, regular maintenance and replacement of the dielectric window 31 may be reduced. In addition, an inner surface of the shield member 41 may be performed with surface roughening treatment such as sandblasting, thermal spraying, etc., and has a function similar to an inner lining to reduce falling of particles. In addition, a barrel surface of the barrel-shaped structure formed by the shield member 41 has a plurality of gaps. A gap length may be greater than 70% of a barrel-shaped structure height. A gap width may be greater than 0.5 mm. Thus, the plasma in the first chamber CH1 may be prevented from generating Eddy current loss on the barrel-shaped structure.

To briefly summarize embodiments of the present disclosure, the filter device of embodiments of the present disclosure can have a good shield effect on the RF electric field to divide the vacuum chamber into the plasma generation area and the plasma diffusion area. The filter device made of the aluminum material can almost completely shield the diagonal electric field, which can prevent the glow phenomenon below the filter device. In addition, with the improved design by changing the ratio of the through-hole depth to the through-hole diameter of the filter member and by gradually changing the thickness of the filter member from thicker at the edges to thinner at the center, the ion concentration above the lower electrode platform may be reduced, and the uniformity of the free radicals may be improved in the radial direction of the lower electrode platform.

What is claimed is:

1. A plasma system, comprising:
   a dielectric window, an area surrounded by the dielectric window being configured as a first chamber and configured to accommodate plasma;
   a first adapter arranged under the dielectric window, and an area surrounded by the first adapter being configured as a second chamber;
   a lower electrode platform placed in the second chamber and configured to carry a workpiece; and
   a filter device including:
      a filter member placed at an intersection of the first chamber and the second chamber and including a plurality of through-holes configured to filter out ions in the plasma when the plasma in the first chamber enters the second chamber through the through-holes;
      a first extension member extending from the filter member in a first direction, wherein the first extension member is placed over the first adapter, into the first chamber, and having an outermost end inside the dielectric window; and
      a second extension member extending from a position of the filter member adjacent to the first extension member to an inner side of the first adapter in a second direction and configured to support the filter member, the second direction being perpendicular to the first direction.

2. The plasma system of claim 1, wherein the first extension member extends from an edge of the filter member in the first direction to provide an annular structure.

3. The plasma system of claim 1, wherein:
   a plurality of first extension members are included and arranged at an interval along a circumferential direction of the filter member; and
   each of the plurality of first extension members extends from an edge of the filter member in the first direction to from a protrusion structure.

4. The plasma system of claim 1, wherein:
   the first adapter includes a first gas passage, a gas outlet end of the first gas passage being communicated with the first chamber surrounded by the dielectric window.

5. The plasma system of claim 4, wherein:
   the first extension member comprises a first lower surface arranged over the first adapter, and a second lower surface, a position of the second lower surface in an axial direction of the filter member is higher than a position of the first lower surface in the axial direction of the filter member; and
   the second lower surface and the first adapter form a second gas passage; the gas outlet end of the first gas passage being communicated with the second gas passage, so that reaction gas enters the first chamber after passing through the first gas passage and the second gas passage.

6. The plasma system of claim 1, wherein in an axial direction of the filter member, a thickness of the filter member is greater than a thickness of the first extension member.

7. The plasma system of claim 1, wherein in an axial direction of the filter member, a thickness of the filter member is less than or equal to a thickness of the first extension member.

8. The plasma system of claim 1, wherein an upper surface of the first extension member is coplanar with an upper surface of the filter member.

9. The plasma system of claim 1, wherein the second extension member includes a barrel-shaped structure and surrounds along a circumferential direction of the first adapter.

10. The plasma system of claim 1, wherein:
    the first direction is along a radial direction of the filter member and away from a center axis of the filter member; and
    the second direction is downward along an axial direction of the filter member.

11. The plasma system of claim 1, wherein the filter member has a consistent thickness at different positions in an axial direction of the filter member.

12. The plasma system of claim 11, wherein a ratio of a depth to a diameter of one of the plurality of through-holes ranges from 2 to 20.

13. The plasma system of claim 12, wherein the ratio of the depth to the diameter of one of the plurality of through-holes is 7, 10, or 14.

14. The plasma system of claim 1, wherein a thickness of an edge portion of the filter member is greater than a thickness of a center portion of the filter member.

15. The plasma system of claim 14, wherein a ratio of a depth to a diameter of one of the plurality of through holes ranges from 12 to 30 or ranges from 8.5 to 18.

16. The plasma system of claim 1, wherein an arrangement density of the plurality of through-holes ranges from 0.7 through-hole/cm$^2$ to 3 through-holes/cm$^2$.

17. The plasma system of claim 1, wherein the dielectric window has a hemispherical shape or a barrel shape.

18. The plasma system of claim 17, further comprising:
    a second adapter including an annular bottom arranged on the dielectric window and an annular top;
    a top cover arranged above the dielectric window and including a conductive material; and
    a shield member including:
       an annular main body surrounding on an inner side of the dielectric window in a circumferential direction of the dielectric window; and
       an annular extension member extending from the annular main body and placed over the annular bottom.

19. The plasma system of claim 1, wherein the filter device is made of a conductive material, the conductive material including aluminum.

20. A filter device applied to a plasma system, comprising: a filter member placed at an intersection of a first chamber and a second chamber and including a plurality of through-holes configured to filter out ions from plasma when the plasma of the first chamber enters the second chamber through the through-holes; a first extension member extending from the filter member in a first direction, wherein the first extension member is placed over a first adapter, into the first chamber, and having an outermost end inside a dielectric window; and a second extension member extending from a position of the filter member adjacent to the first extension member to an inner side of the first adapter in a second direction and configured to support the filter member, the second direction being perpendicular to the first direction; wherein the plasma system includes: the dielectric window, an area surrounded by the dielectric window being configured as the first chamber and configured to accommodate the plasma; the first adapter arranged under the dielectric window, an area surrounded by the first adapter being configured as the second chamber; a lower electrode platform placed in the second chamber and configured to carry a workpiece.

* * * * *